United States Patent
Lin et al.

(10) Patent No.: US 11,605,579 B2
(45) Date of Patent: Mar. 14, 2023

(54) SEMICONDUCTOR DEVICE HAVING PASSIVATION LAYER AND METHOD OF MANUFACTURING THE SAME

(71) Applicant: TAIWAN SEMICONDUCTOR MANUFACTURING COMPANY LTD., Hsinchu (TW)

(72) Inventors: Jing-Cheng Lin, Hsinchu (TW); Li-Hui Cheng, New Taipei (TW); Po-Hao Tsai, Taoyuan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/739,913

(22) Filed: Jan. 10, 2020

(65) Prior Publication Data

US 2020/0152560 A1 May 14, 2020

Related U.S. Application Data

(62) Division of application No. 15/674,104, filed on Aug. 10, 2017, now Pat. No. 10,535,591.

(51) Int. Cl.
| | |
|---|---|
| H01L 23/498 | (2006.01) |
| H01L 23/31 | (2006.01) |
| H01L 23/00 | (2006.01) |
| H01L 25/065 | (2006.01) |
| H01L 25/16 | (2006.01) |
| H01L 21/48 | (2006.01) |
| H01L 21/56 | (2006.01) |

(52) U.S. Cl.
CPC .... *H01L 23/49816* (2013.01); *H01L 21/4853* (2013.01); *H01L 23/3128* (2013.01);
(Continued)

(58) Field of Classification Search
CPC ........... H01L 23/49816; H01L 23/3128; H01L 23/49838; H01L 23/49894; H01L 24/16; H01L 2224/97
See application file for complete search history.

(56) References Cited

U.S. PATENT DOCUMENTS

| | | |
|---|---|---|
| 9,082,776 B2 | 7/2015 | Lu et al. |
| 9,997,440 B2 | 6/2018 | Chiou et al. |

(Continued)

FOREIGN PATENT DOCUMENTS

| | | |
|---|---|---|
| CN | 102024713 A | 4/2011 |
| CN | 103633059 A | 3/2014 |

OTHER PUBLICATIONS

Office Action dated Jun. 6, 2021 by the China National Intellectual Property Administration for the corresponding Chinese, P.R.C. Patent Application No. 201711192001.0.

(Continued)

*Primary Examiner* — Steven B Gauthier
*Assistant Examiner* — Candice Chan
(74) *Attorney, Agent, or Firm* — WPAT Law; Anthony King

(57) ABSTRACT

A semiconductor device includes a substrate, an electrical conductor and a passivation layer. The substrate includes a first surface. The electric conductor is over the first surface of the substrate. The passivation layer is over the first surface of the substrate. The passivation layer includes a first part and a second part. In some embodiments, the first part is in contact with an edge of the electrical conductor, the second part is connected to the first part and apart from the edge of the electrical conductor, and the first part of the passivation layer has curved surface.

20 Claims, 23 Drawing Sheets

(52) U.S. Cl.
CPC .. *H01L 23/49838* (2013.01); *H01L 23/49894* (2013.01); *H01L 21/563* (2013.01); *H01L 23/49827* (2013.01); *H01L 24/13* (2013.01); *H01L 24/16* (2013.01); *H01L 24/81* (2013.01); *H01L 25/0655* (2013.01); *H01L 25/16* (2013.01); *H01L 2224/0401* (2013.01); *H01L 2224/10126* (2013.01); *H01L 2224/13007* (2013.01); *H01L 2224/16227* (2013.01); *H01L 2224/16238* (2013.01); *H01L 2224/73204* (2013.01); *H01L 2224/97* (2013.01)

(56) References Cited

U.S. PATENT DOCUMENTS

| | | |
|---|---|---|
| 2003/0151032 A1 | 8/2003 | Ito et al. |
| 2007/0045780 A1 | 3/2007 | Akram et al. |
| 2012/0028412 A1 | 2/2012 | Jeong et al. |
| 2013/0127045 A1* | 5/2013 | Lin .................. H01L 24/05 257/737 |
| 2013/0146900 A1 | 6/2013 | Yeo et al. |
| 2013/0219969 A1 | 8/2013 | Bhagavatula et al. |
| 2014/0145327 A1 | 5/2014 | Jeon et al. |
| 2015/0115440 A1 | 4/2015 | Higuchi |
| 2016/0079204 A1* | 3/2016 | Matsubara ............ H01L 21/56 438/114 |

OTHER PUBLICATIONS

U.S. Pat. No. 9082776 is the counterpart to CN 103633059.
U.S. Pat. No. 9997440B2 Corresponds to CN102024713A.

* cited by examiner

SEMICONDUCTOR DEVICE HAVING PASSIVATION LAYER AND METHOD OF MANUFACTURING THE SAME

PRIORITY DATA

This patent is a divisional application of U.S. patent application Ser. No. 15/674,104 filed on Aug. 10, 2017, entitled of "SEMICONDUCTOR DEVICE AND METHOD OF MANUFACTURING THE SAME", the entire disclosure of which is hereby incorporated by reference.

BACKGROUND

In the packaging of integrated circuits, semiconductor dies may be stacked through bonding, and may be bonded to other package components such as interposers and package substrates. The resulting packages are known as Three-Dimensional Integrated Circuits (3DICs). Wafer cracking and stress issues, however, are challenges in the 3DICs.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
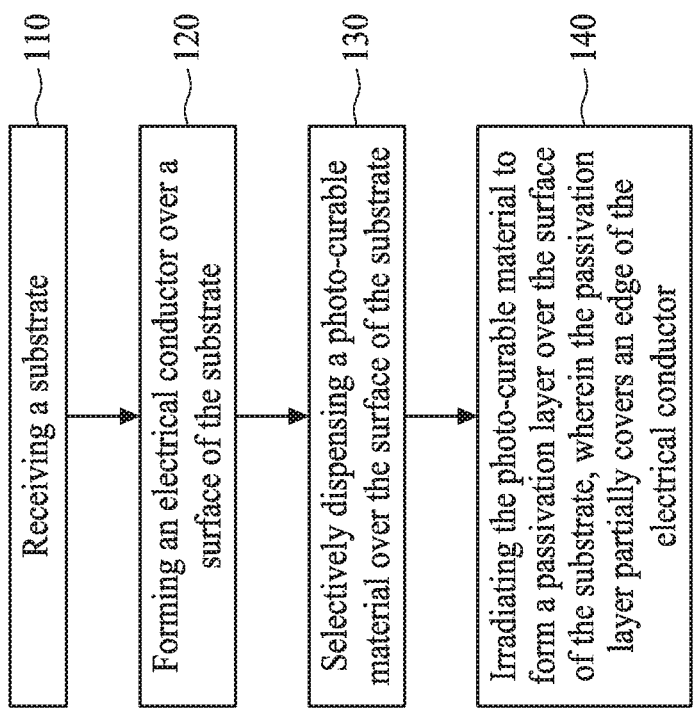
FIG. 1 is a flow chart illustrating a method of manufacturing a semiconductor device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.050.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments of the present disclosure, a semiconductor device including a passivation layer covering a surface of the substrate and enclosing an edge of an electrical conductor is provided. The passivation layer helps to enhance robustness of the electrical conductor, and alleviate stress between the substrate and the electrical conductor so as to reduce the risk of cracking.

FIG. 1 is a flow chart illustrating a method of manufacturing a semiconductor device according to various aspects of one or more embodiments of the present disclosure. The method 100 begins with operation 110 in which a substrate is received. The method proceeds with operation 120 in which an electrical conductor is formed over a surface of the substrate. The method proceeds with operation 130 in which a photo-curable material is selectively dispensed over the surface of the substrate. The method continues with operation 140 in which the photo-curable material is irradiated to form a passivation layer over the surface of the substrate, wherein the passivation layer partially covers an edge of the electrical conductor.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
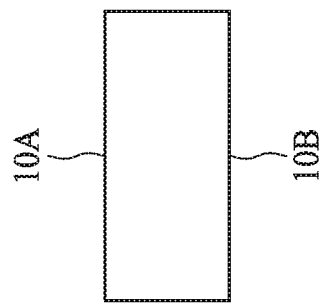
FIG. 2A, FIG. 2B, FIG. 2C, FIG. 2D, FIG. 2E, FIG. 2F and FIG. 2G are schematic views at one of various operations of manufacturing a semiconductor device according to one or more embodiments of the present disclosure.
Figure 2A:
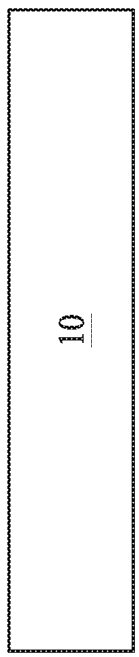
Figure 2A:
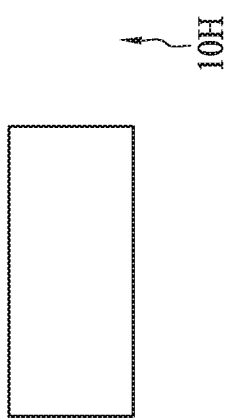
Figure 2B:
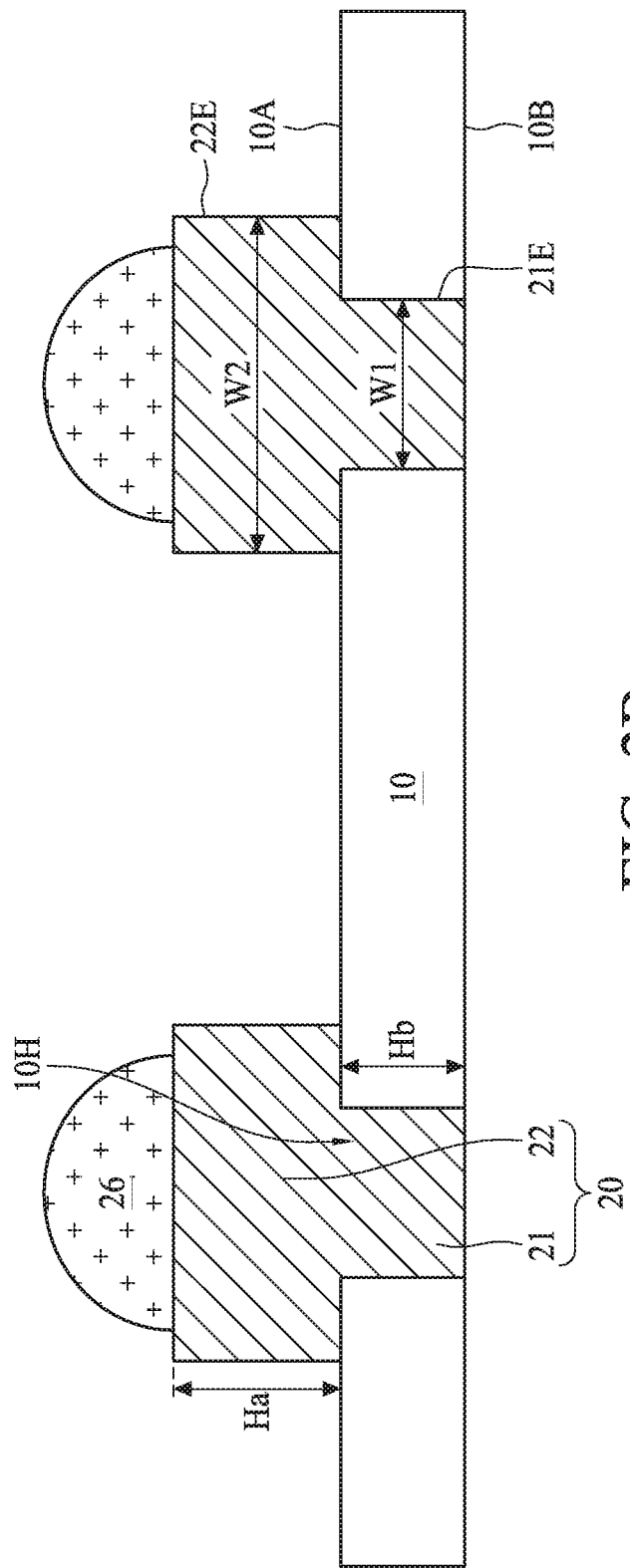
Figure 2C:
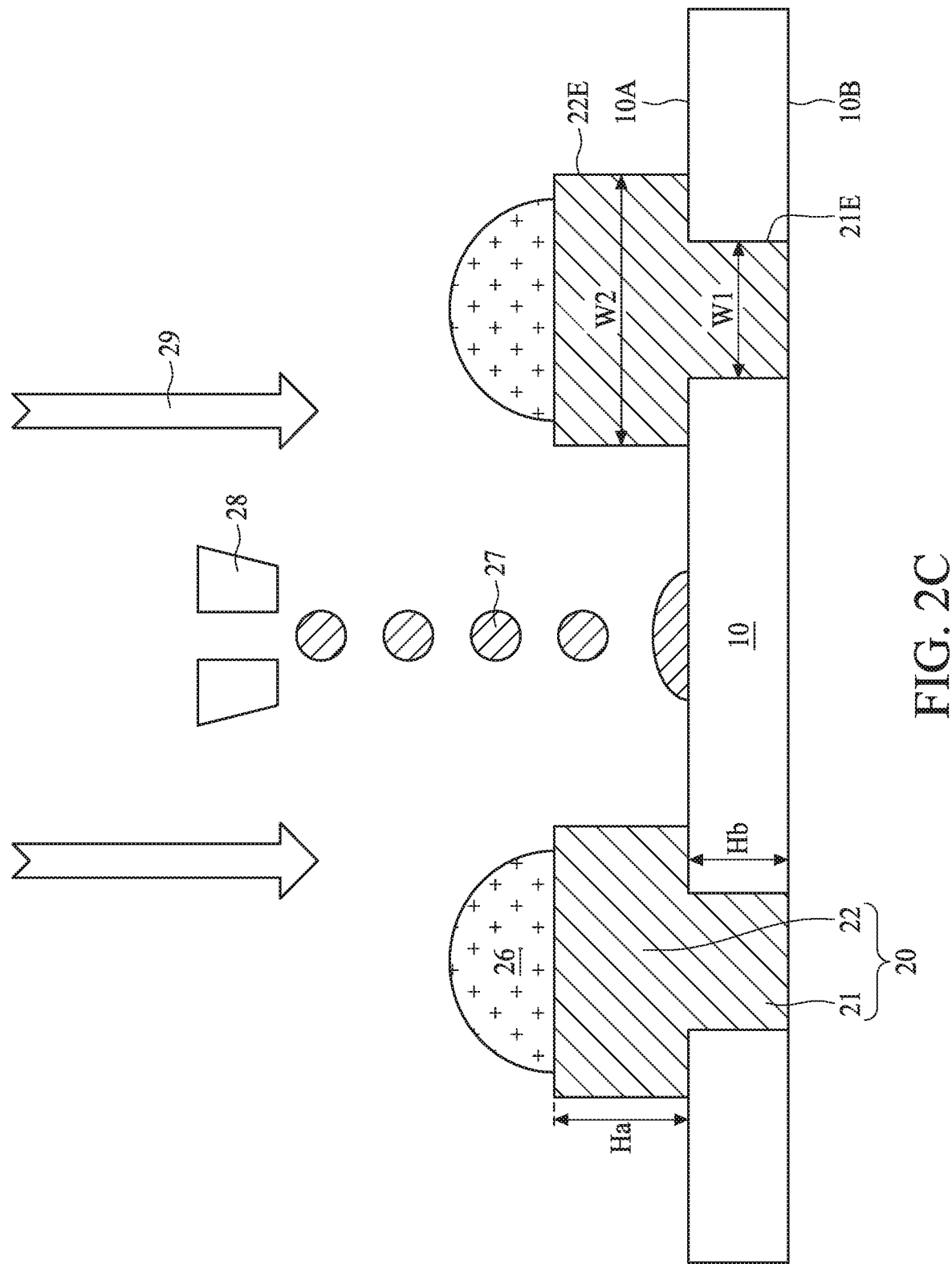
Figure 2D:
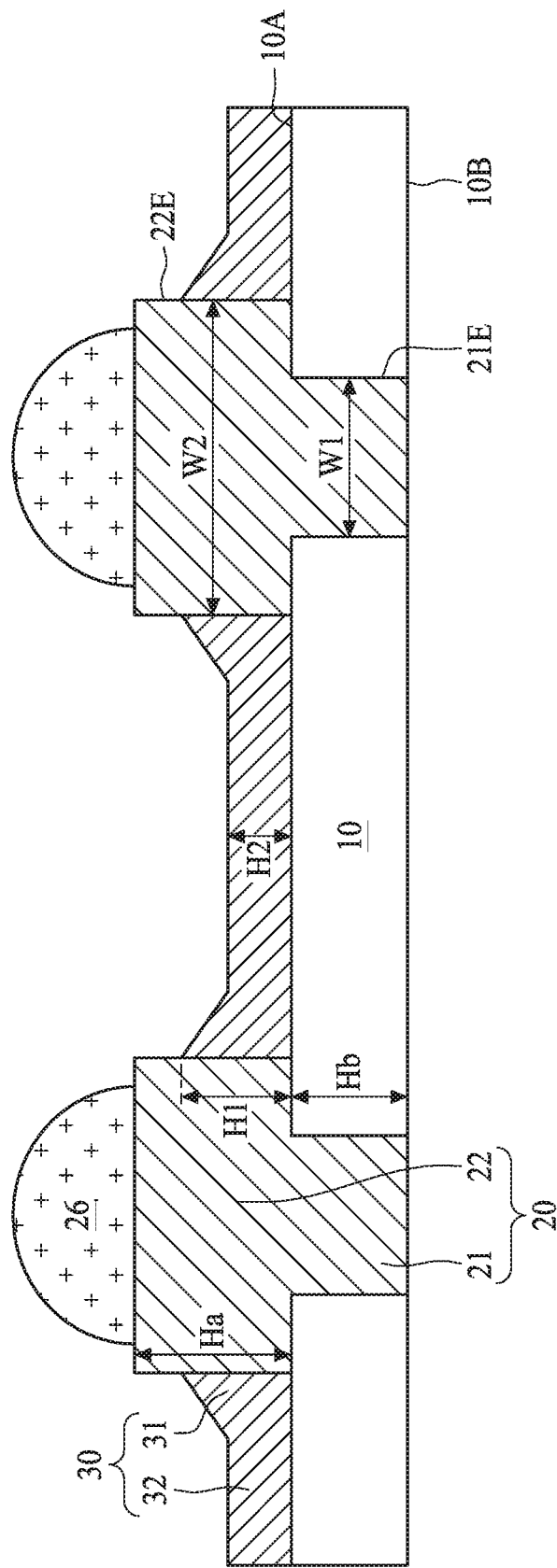
Figure 2E:
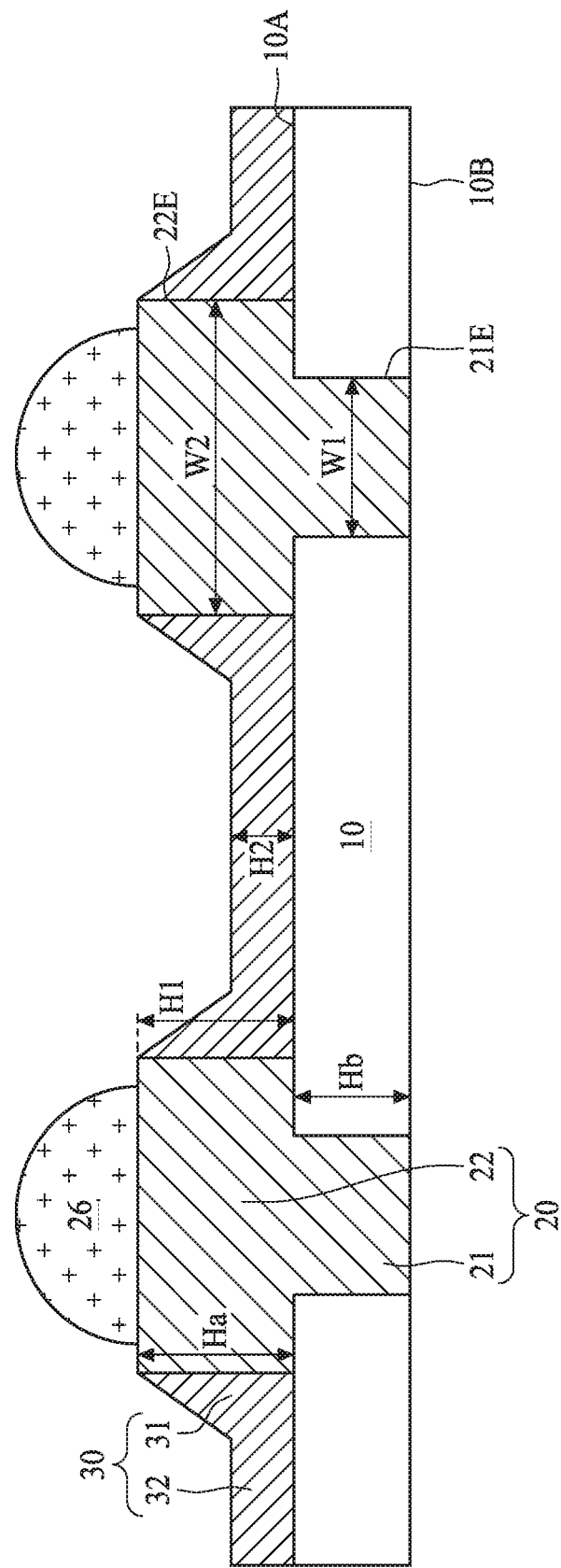
Figure 2F:
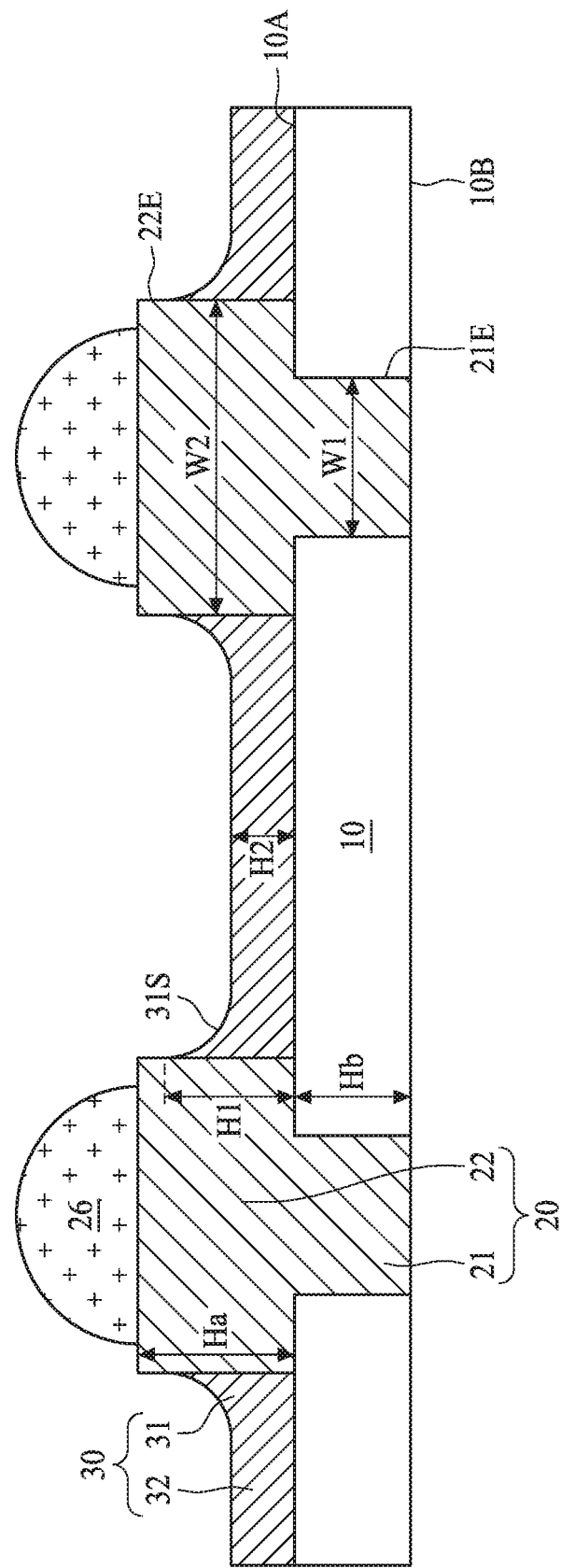
Figure 2G:
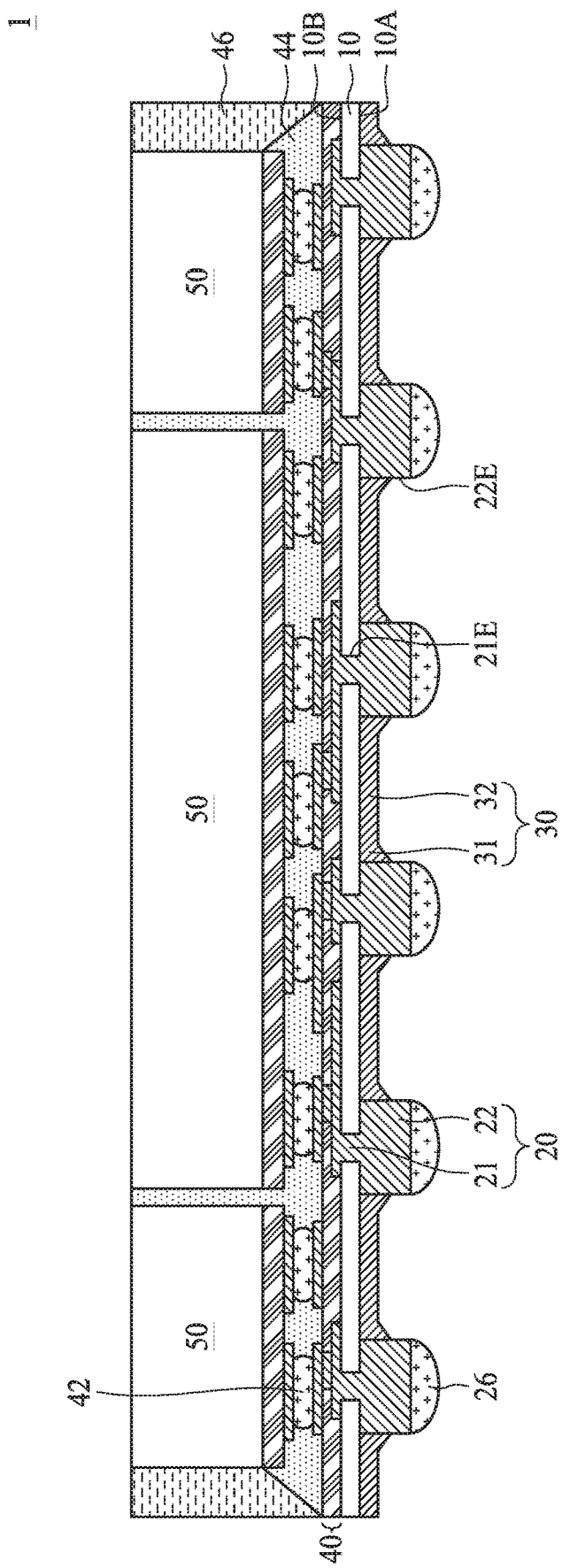

FIG. 2A, FIG. 2B, FIG. 2C, FIG. 2D, FIG. 2E, FIG. 2F and FIG. 2G are schematic views at one of various operations of manufacturing a semiconductor device according to one or more embodiments of the present disclosure, where FIG. 2A, FIG. 2B, FIG. 2C, FIG. 2D, FIG. 2E and FIG. 2F are schematic partial enlarged cross-sectional views, and FIG. 2G is a schematic cross-sectional view. It is noted that the method of some embodiments may be a wafer level method. As depicted in FIG. 2A, a substrate 10 is received. In some embodiments, the substrate 10 may include a wafer, a semiconductor substrate, an interposer, a package substrate or the like. The substrate 10 includes a surface e.g., a first surface 10A, and another surface e.g., a second surface 10B opposite to the first surface 10A. In some embodiments, the substrate 10 includes one or more through holes 10H penetrating through the substrate 10. In some embodiments, the through holes 10H may be formed from the first surface 10A of the substrate 10. In some embodiments, the through holes 10H may be formed from the second surface 10B of the substrate 10. In some embodiments, the through holes 10H may be formed by recessing one of the first surface 10A or the second surface 10B of the substrate 10 without penetrating the substrate 10, and then thinning the substrate 10 from the other one of the first surface 10A or the second surface 10B. In some embodiments, the substrate 10 is a thin substrate having a thickness in micrometer scale. In some embodiments, the thickness of the substrate 10 is substantially ranging from about 5 micrometers to about 15 micrometers such as about 10 micrometers, but is not limited thereto. In some embodiments, the through holes 10H may be formed by isotropic etching, anisotropic etching, a combination thereof, or other suitable operation. In some embodiments, an sidewall of the through hole 10H may be substantially perpendicular to the first surface 10A or the second surface 10B. In some embodiments, the sidewall of the through hole 10H may be inclined with respect to the first surface 10A or the second surface 10B. In some embodiments, the dimension of the through hole 10H proximal to the second surface 10B is larger than the dimension of the through hole 10H proximal to the first surface 10A. In some embodiments, the dimension of the through hole 10H proximal to the first surface 10A is larger than the dimension of the through hole 10H proximal to the second surface 10B.

As depicted in FIG. 2B, one or more electrical conductors e.g., first electrical conductors 20 are formed over the first surface 10A of the substrate 10. In some embodiments, the first electrical conductors 20 may include, but are not limited to, conductive bumps such as controlled collapse chip connection bumps (C4 bumps) or the like. In some embodiments, the first electrical conductor 20 may include a first portion 21, and a second portion 22 connected to the first portion 21. In some embodiments, the first portion 21 is substantially formed in the through hole 10H, and the second portion 22 is formed over the first surface 10A of the substrate 10 and outside the through hole 10H. The first electrical conductor 20 may include conductive material such as metal or alloy, but not limited thereof. In some embodiments, the material of the first electrical conductor 20 may include, but is not limited to, copper, an alloy thereof or the like. The first electrical conductor 20 may be formed by electroplating, deposition or other suitable operation. In some embodiments, the first portion 21 and the second portion 22 of the first electrical conductor 20 may be formed of the same material, but is not limited thereto. In some embodiments, the first portion 21 and the second portion 22 of the first electrical conductor 20 may be formed separately. In some embodiments, the first portion 21 may be formed in the through hole 10H from the second surface 10B of the substrate 10, while the second portion 22 may be formed over the first surface 10A of the substrate 10 after the first portion 21 is formed. In some embodiments, the first portion 21 and the second portion 22 of the first electrical conductor 20 may be formed from the first surface 10A of the substrate 10. In some embodiments, the first portion 21 of the first electrical conductor 20 includes a first width W1, and the second portion 22 of the first electrical conductor 20 includes a second width W2 wider than the first width W1. In some embodiments, a height Ha of the second portion 22 is greater than a height of the first portion 21, but not limited thereto. By way of example, the height Ha of the second portion 22 is substantially ranging from about 10 micrometers to about 50 micrometers, and the height Hb of the first portion 21 is substantially ranging from about 5 micrometers to about 20 micrometers such as about 10 micrometers, but not limited thereto.

In some embodiments, a conductive bump 26 may be formed over the second portion 22 of the first electrical conductor 20. The conductive bump 26 may be configured to be electrically connected to a package substrate or other electronic device. In some embodiments, the conductive bump 26 is formed from a conductive material having a melting point lower than that of the first electrical conductor 20. In some embodiments, the material of the conductive bump 26 may include, but is not limited to, tin (Sn), an alloy thereof or the like.

In some embodiments, a passivation layer is formed over the first surface 10A of the substrate 10. In some embodiments, the passivation layer may be formed by the operations illustrated in FIG. 2C and FIG. 2D, but not limited thereto. As depicted in FIG. 2C, a photo-curable material 27 is selectively dispensed over the first surface 10A of the substrate 10. In some embodiments, the photo-curable material 27 includes a polymeric material with photo sensitive characteristic. In some embodiments, the polymeric material for the photo-curable material 27 may include, but is not limited to, epoxy, acrylic resin, polyimide (PI), polybenzoxazole (PBO) or the like. In some embodiments, the photo-curable material 27 may be selectively dispensed by printing or the like through a nozzle 28. In some embodiments, the photo-curable material 27 is irradiated by light beams 29 such as UV beams or other magnetic wave simultaneously when it is dispensed. In some embodiments, the irradiation helps to reduce fluidity of the photo-curable material 27 and solidify the photo-curable material 27.

As depicted in FIG. 2D, the passivation layer 30 may be formed over the first surface 10A of the substrate 10, partially covering an edge of the first electrical conductor 20 after the photo-curable material 27 is cured and solidified. In some embodiments, the passivation layer 30 partially covers an edge 22E of the second portion 22 of the first electrical conductor 20. In some embodiments, the passivation layer 30 is not disposed between an edge 21E of the first portion 21 of the first electrical conductor 20 and the sidewall of the through hole 10H. In some embodiments, the passivation layer 30 includes a first part 31 in contact with the edge 22E of the second portion 22 of the first electrical conductor 20, and a second part 32 apart from the edge 22E of the second portion 22, covering the first surface 10A of the substrate 10, and connected to the first part 31. In some embodiments, the first part 31 of the passivation layer 30 at least partially covers the edge 22E and partially exposes the edge 22E of the second portion 22 of the first electrical conductor 20. In some embodiments, the first part 31 of the passivation layer 30 may include a doughnut-shaped (i.e., ring-shaped) structure surrounding the edge 22E of the second portion 22, and the second part 32 is connected to the first part 31 and covers the first surface 10A of the substrate 10. In some embodiments, a first height H1 of the first part 31 of the passivation layer 30 is lower than the height Ha of the second portion 22 of the first electrical conductor 20 as shown in FIG. 2D. In some alternative embodiments, the first height H1 of the first part 31 of the passivation layer 30 may be substantially equal to the height Ha of the second portion 22 of the first electrical conductor 20 as shown in FIG. 2E. In some embodiments, the first height H1 of the first part 31 is about half the height Ha of the second portion 22 or less than half the height Ha of the second portion 22, but is not limited thereto. In some embodiments, a first height H1 of the first part 31 of the passivation layer 30 is larger than a second height H2 of the second part 32 of the passivation layer 30. In some embodiments, a ratio of the first height H1 to the second height H2 is greater than 1 and substantially less than about 15, substantially greater than about 1.5 and substantially less than about 15, or substantially greater than about 1.5 and substantially less than about 8, but is not limited thereto. In some embodiments, the first height H1 of the first part 31 is substantially ranging from about 5 micrometers to about 50 micrometers, substantially ranging from about 5 micrometers to about 40 micrometers, or substantially ranging from about 5 micrometers to about 30 micrometers, but is not limited thereto. In some embodiments, the second height H2 of the second part 32 is substantially ranging from about 2 micrometers to about 15 micrometers, but is not limited thereto.

In some embodiments, the second part 32 of the passivation layer 30 helps to protect the substrate 10 from cracking, for example when the substrate 10 is thin. In some embodiments, the first part 31 of the passivation layer 30 with higher height H1 helps to enhance the robustness of the first electrical conductor 20, and helps to alleviate stress between the substrate 10 and the first electrical conductor 20.

In some embodiments, the material of the photo-curable material 27 is hydrophilic, which helps the photo-curable material 27 to cover the edge 22E of the second portion 22 of the first electrical conductor 20 due to capillary phenomenon. In such a case, the passivation layer 30 with different profiles can be formed without additional photolithography operation. In some embodiments, the photo-curable material 27 can be selectively dispensed to avoid residues on the first electrical conductor 20, and additional descum treatment such as plasma treatment may be omitted. In some embodiments, the first part 31 of the passivation layer 30 formed by a hydrophilic material may have a curved surface 31S. By way of example, the curved surface 31S may include a concaved surface as depicted in FIG. 2F.

As depicted in FIG. 2G, other components or layers may be formed over the second surface 10B of the substrate prior to or subsequent to formation of the first electrical conductors 20 and the passivation layer 30. In some embodiments, a circuit layer 40 is formed over the second surface 10B of the substrate 10 and electrically connected to the first electrical conductors 20. In some embodiments, the circuit layer 40 may include, but is not limited to, a redistribution layer (RDL), a conductive post, a conductive pillar, a combination thereof or the like. In some embodiments, at least one semiconductor die 50 is formed over the circuit layer 40. In some embodiments, the at least one semiconductor die 50 may include an active semiconductor die, a passive semiconductor die, or a combination thereof. By way of example, the at least one semiconductor die 50 may include a system on chip (SOC) die, a memory die or the like. In some embodiments, second electrical conductors 42 may be formed between the at least one semiconductor die 50 and the circuit layer 40, and electrically connected to the at least one semiconductor die 50 and the circuit layer 40. In some embodiments, the second electrical conductors 42 may include conductive bumps, conductive balls, conductive pastes or the like. In some embodiments, an underfill layer 44 may be formed over the second surface 10B of the substrate 10, between the at least one semiconductor die 50 and the circuit layer 40, and around the second electrical conductors 42. In some embodiments, the underfill layer 44 is configured to protect and fix the at least one semiconductor die 50 and the second electrical conductors 42. In some embodiments, an encapsulant 46 may be formed over the second surface 10B of the substrate 10. In some embodiments, the encapsulant 46 may laterally enclose the at least one semiconductor die 50 and the underfill layer 44. In some embodiments, the encapsulant 46 may further cover an upper surface of the at least one semiconductor die 50. In some embodiments, the material of the encapsulant 46 may include, but is not limited to, a molding compound such as epoxy or the like. In some embodiments, the semiconductor device 1 may be a chip-on-wafer (CoW) device, but is not limited thereto. In some embodiments, a singulation operation such as dicing operation may be performed to form a semiconductor device 1. In some embodiments, the semiconductor device 1 may be electrically connected to a package substrate through the first electrical conductors 20 to form a chip-on-wafer-on-substrate (CoWoS) package.

In some embodiments of the present disclosure, the passivation layer 30 with a thicken first part 31 seals the edge 22E of the second portion 22 of the first electrical conductor 20, and thus helps to enhance the robustness of the first electrical conductor 20. The passivation layer 30 with the first part 31 covering the edge 22E of the second portion 22 and the second part 32 covering the first surface 10A of the substrate 10 may also help to compensate or alleviate stress between the substrate 10 and the first electrical conductor 20, and thus may help to alleviate warpage of the substrate 10. In some embodiments, the passivation layer 30 may be formed from the photo-curable material 27 by selectively dispensing. The photo-curable material 27 may be a hydrophilic material, which can climb up to the edge 22E of the second portion 22 of the first electrical conductor 20 due to capillary phenomenon. In such a case, the passivation layer 30 with different profiles can be formed without additional photolithography operation. In some embodiments, the photo-curable material 27 can be selectively dispensed to avoid residues on the first electrical conductor 20, and additional descum treatment may be omitted.

The semiconductor device and its manufacturing method of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3A:
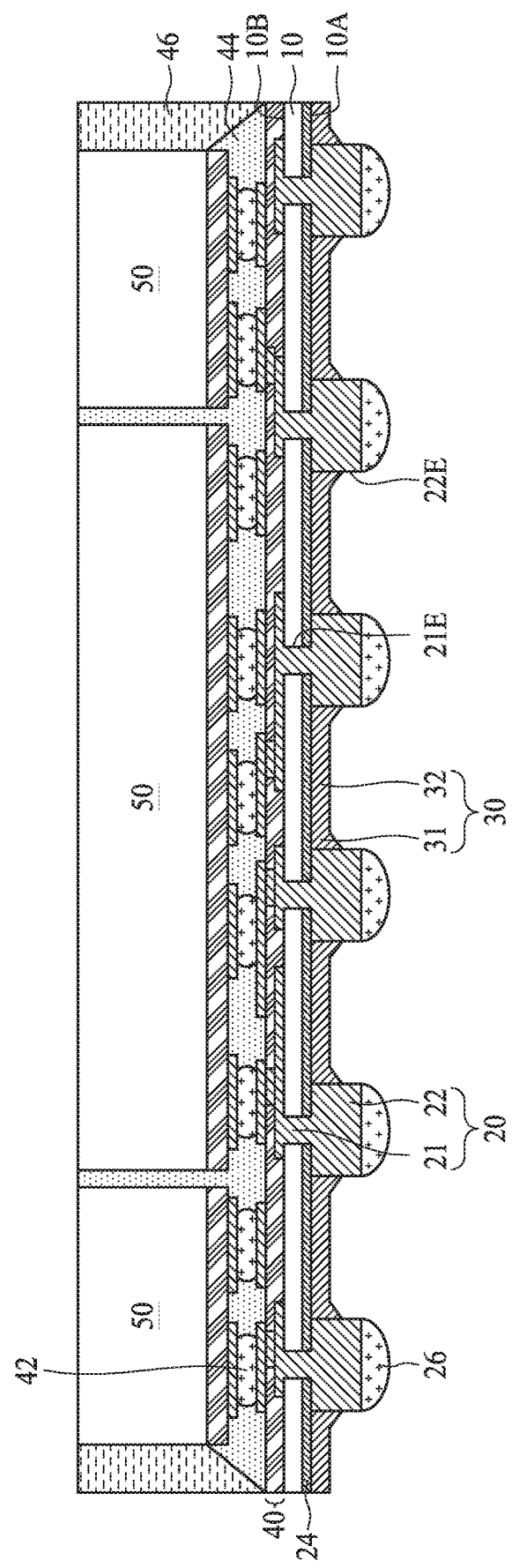
FIG. 3A and FIG. 3B are schematic views of a semiconductor device according to one or more embodiments of the present disclosure.
Figure 3B:
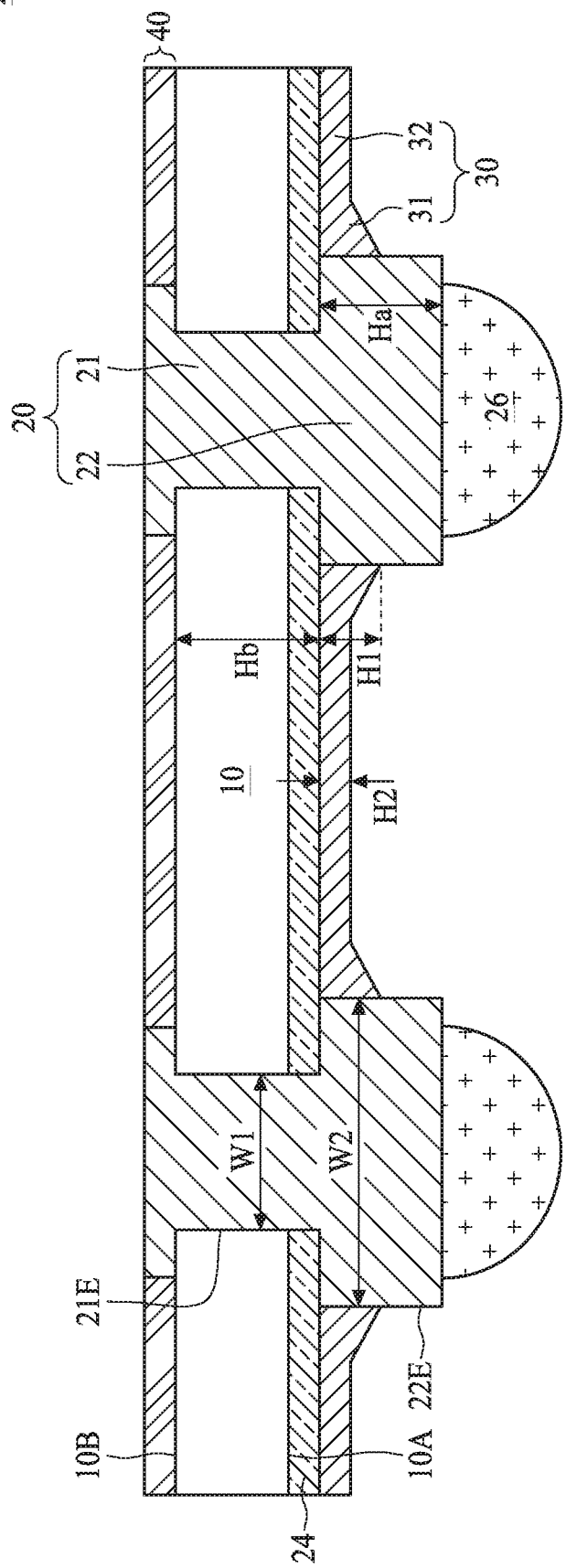

FIG. 3A and FIG. 3B are schematic views of a semiconductor device according to one or more embodiments of the present disclosure, where FIG. 3A is a schematic cross-sectional view, and FIG. 3B is a schematic partial enlarged cross-sectional view. As depicted in FIG. 3A and FIG. 3B, different from the semiconductor device 1 of FIG. 2E, the semiconductor device 2 may further include an insulative layer 24 formed over the first surface 10A of the substrate 10 before formation of the second portion 22 of the first electrical conductor 20. In some embodiments, the insulative layer 24 may include a polymeric material formed by low temperature operation. In some embodiments, the material of the insulative layer 24 may include, but is not limited to, polyimide. In some embodiments, the thickness of the insulative layer 24 is substantially ranging from about 0.5 micrometers to about 15 micrometers such as about 4 micrometers, but is not limited thereto. In some embodiments, the second portion 22 of the first electrical conductor 20 is formed over the insulative layer 24, and electrically connected to the first portion 21. In some embodiments, the passivation layer 30 is formed over the insulative layer 24, partially covering an edge of the first electrical conductor 20. In some embodiments, the passivation layer 30 may be formed in a similar way as disclosed in FIG. 2C, but is not limited thereto. In some embodiments, the passivation layer 30 includes the first part 31 with the first height H1 and in contact with the edge 22E of the second portion 22 of the first electrical conductor 20, and the second part 32 with the second height H2 and apart from the edge 22E of the second portion 22 of the first electrical conductor 20 and connected to the first part 31.

Figure 4A:
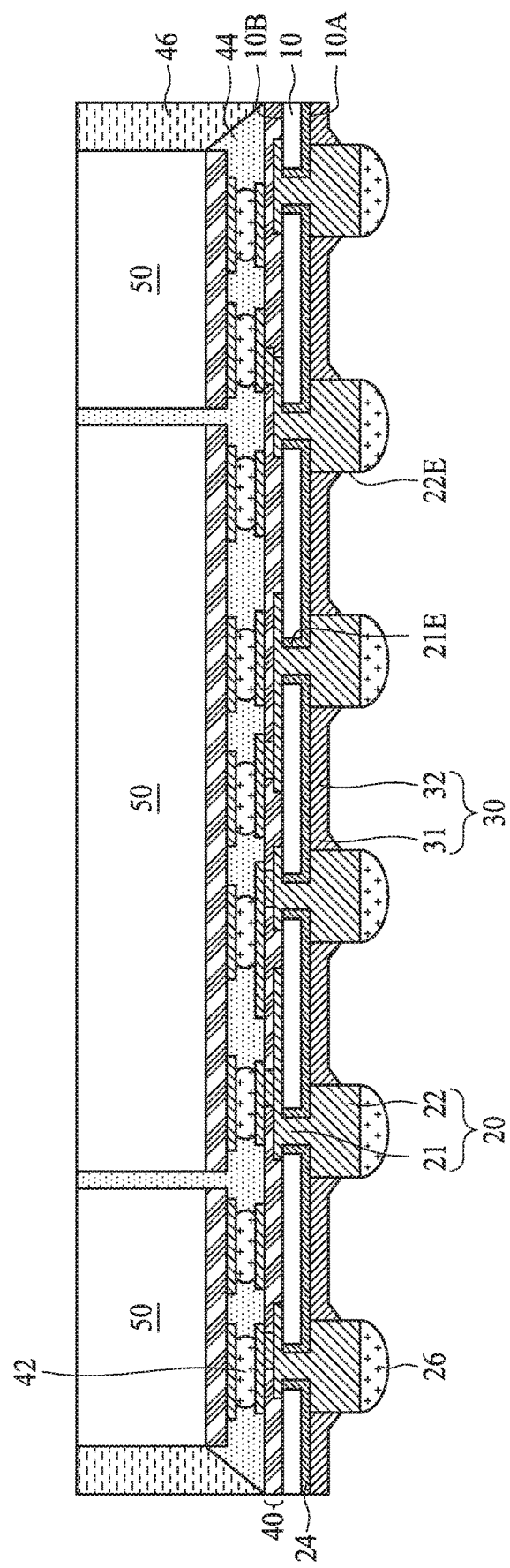
FIG. 4A and FIG. 4B are schematic views of a semiconductor device according to one or more embodiments of the present disclosure.
Figure 4B:
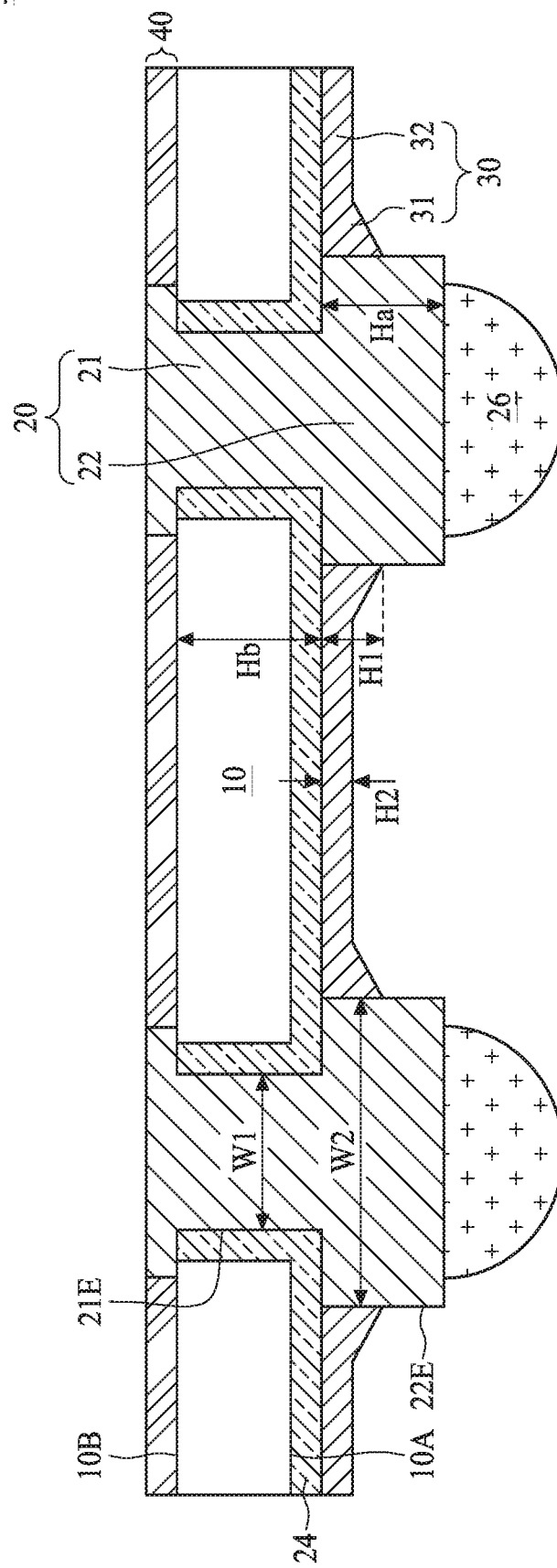

FIG. 4A and FIG. 4B are schematic views of a semiconductor device according to one or more embodiments of the present disclosure, where FIG. 4A is a schematic cross-sectional view, and FIG. 4B is a schematic partial enlarged cross-sectional view. As depicted in FIG. 4A and FIG. 4B, different from the semiconductor device 2 of FIG. 3A and FIG. 3B, the insulative layer 24 of the semiconductor device 3 may be formed over the first surface 10A of the substrate 10 before formation of the first portion 21 and the second portion 22 of the first electrical conductor 20. In some embodiments, the first portion 21 of the first electrical conductor 20 is formed in the substrate 10, and the insulative 24 is extended between the substrate 10 and the edge 21E of the first portion 21 of the first electrical conductor 20. In some embodiments, the second portion 22 of the first electrical conductor 20 is formed over the insulative layer 24, and electrically connected to the first portion 21. In some embodiments, the passivation layer 30 is formed over the insulative layer 24, partially covering an edge of the first electrical conductor 20. In some embodiments, the passivation layer 30 includes the first part 31 with the first height H1 and in contact with the edge 22E of the second portion 22 of the first electrical conductor 20, and the second part 32 with the second height H2 and apart from the edge 22E of the second portion 22 of the first electrical conductor 20 and connected to the first part 31.

Figure 5A:
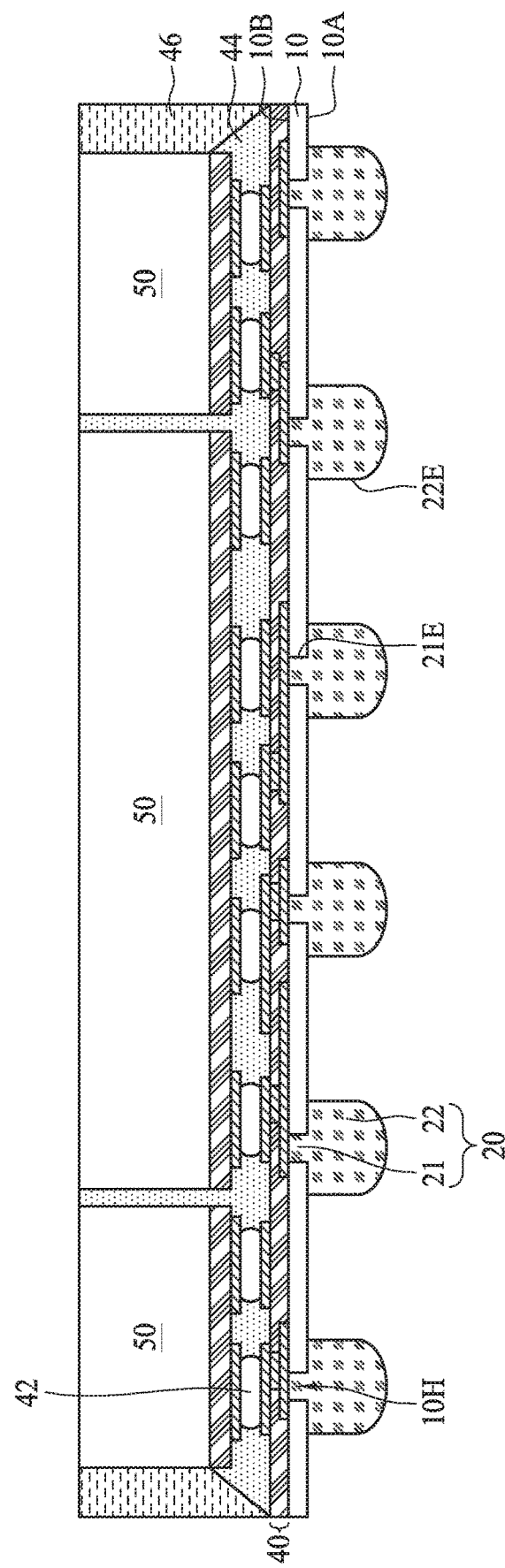
FIG. 5A, FIG. 5B, FIG. 5C and FIG. 5D are schematic views at one of various operations of manufacturing a semiconductor device according to one or more embodiments of the present disclosure.
Figure 5B:
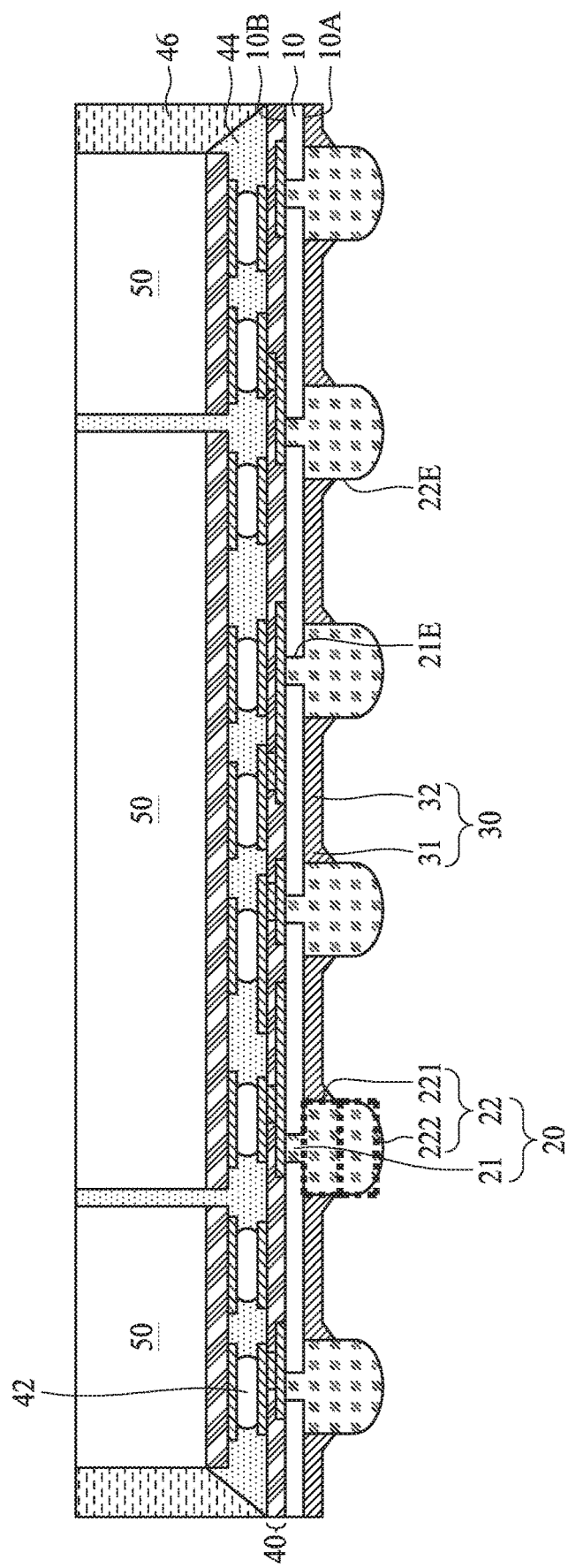
Figure 5C:
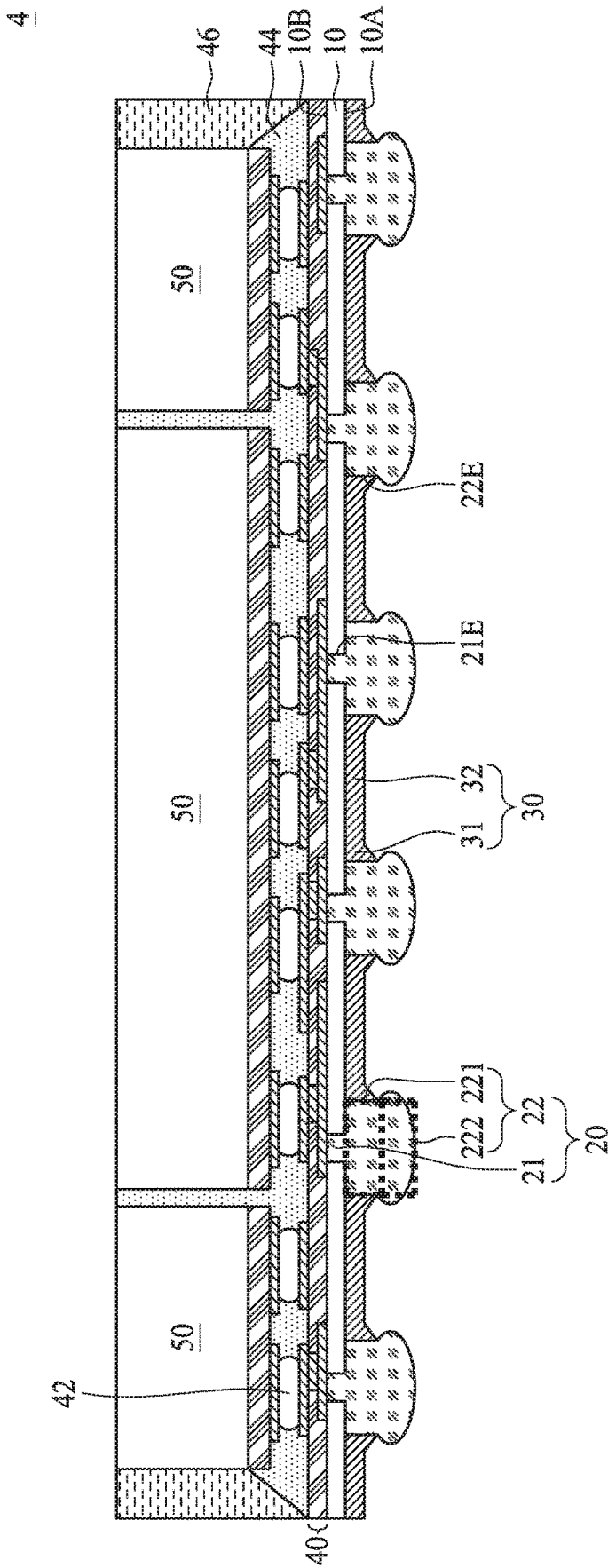
Figure 5D:
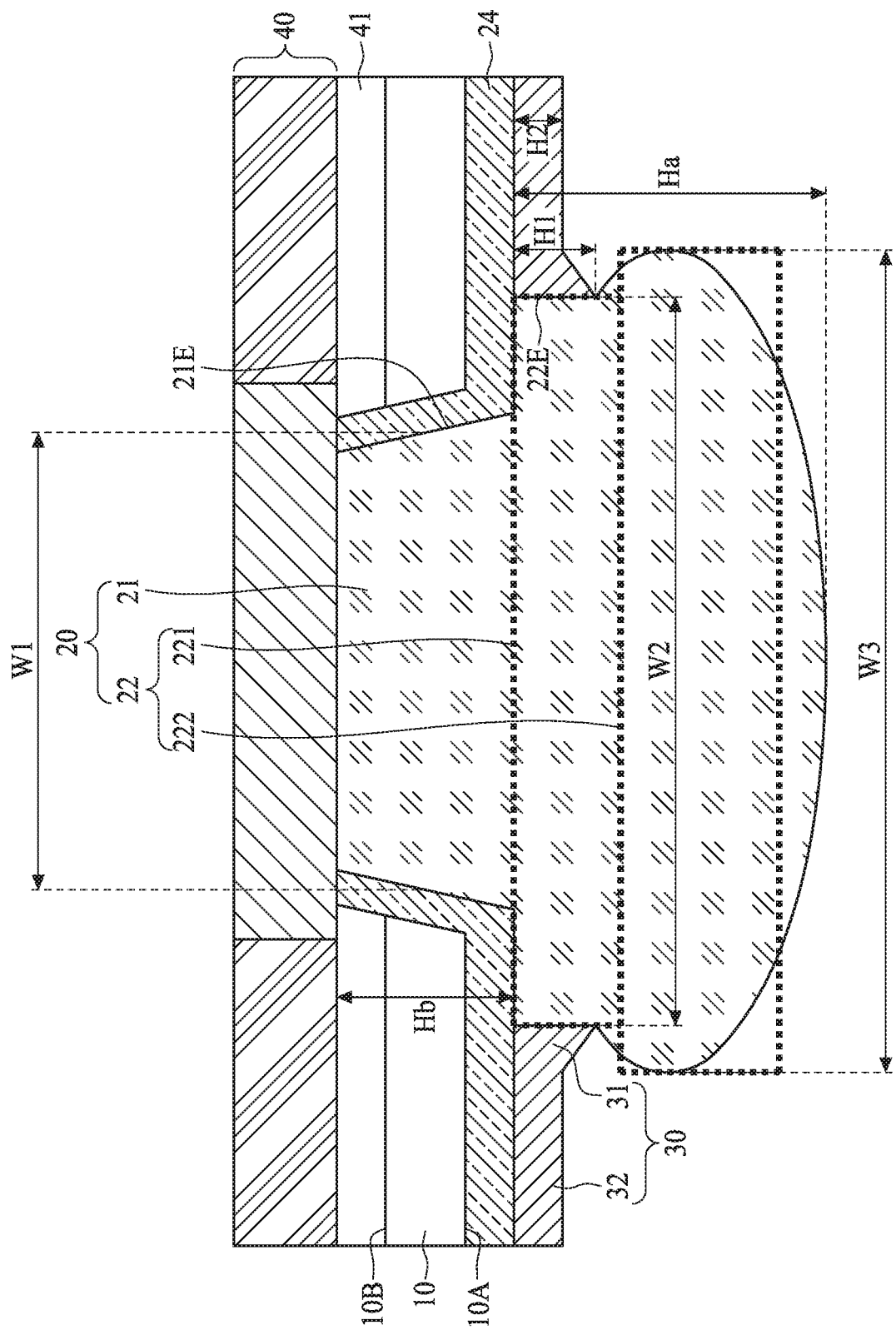

FIG. 5A, FIG. 5B, FIG. 5C and FIG. 5D are schematic views at one of various operations of manufacturing a semiconductor device according to one or more embodiments of the present disclosure, where FIG. 5A, FIG. 5B and FIG. 5C are schematic cross-sectional views, and FIG. 5D is a schematic partial enlarged cross-sectional view. As depicted in FIG. 5A, a substrate 10 is received. In some embodiments, a circuit layer 40 is formed over the second surface 10B of the substrate 10. In some embodiments, a dielectric layer 41 (shown in FIG. 5D) may be formed between second surface 10B of the substrate 10 and the circuit layer 40. In some embodiments, at least one semiconductor die 50 is formed over the circuit layer 40. In some embodiments, second electrical conductors 42 may be formed between the at least one semiconductor die 50 and the circuit layer 40, and electrically connected to the at least one semiconductor die 50 and the circuit layer 40. In some embodiments, an underfill layer 44 may be formed over the second surface 10B of the substrate 10, between the at least one semiconductor die 50 and the circuit layer 40, and around the second electrical conductors 42. In some embodiments, an encapsulant 46 may be formed over the second surface 10B of the substrate 10.

In some embodiments, first electrical conductors 20 may be formed over the first surface 10A of the substrate 10. In some embodiments, the first electrical conductor 20 may include a first portion 21, and a second portion 22 connected to the first portion 21. In some embodiments, the first portion 21 is substantially formed in a through hole 10H, and the second portion 22 is formed over the first surface 10A of the substrate 10 and outside the through hole 10H. In some embodiments, the first portion 21 and the second portion 22 may be formed from the same conductive material. In some embodiments, the material of the first electrical conductor 20 may include, but is not limited to, tin, an alloy thereof or the like. In some embodiments, the width of the second portion 22 is wider than the width of the first portion 21.

As depicted in FIG. 5B, a passivation layer 30 is formed over the first surface 10A of the substrate 10, partially covering an edge of the first electrical conductor 20. In some embodiments, the passivation layer 30 may be formed in a similar way as disclosed in FIG. 2C, but is not limited thereto. In some embodiments, the passivation layer 30 includes the first part 31 with the first height H1 (shown in FIG. 5D) and in contact with the edge 22E of the second portion 22 of the first electrical conductor 20, and the second part 32 with the second height H2 (shown in FIG. 5D) and apart from the edge 22E of the second portion 22 of the first electrical conductor 20 and connected to the first part 31. In some embodiments, the passivation layer 30 may surround the edge 22E of the second portion 22 of the first electrical conductor 20. In some embodiments, an insulative layer 24 (shown in FIG. 5D) may be formed prior to formation of the passivation layer 30. In some embodiments, the second part 32 of the passivation layer 30 helps to protect the substrate 10 from cracking. In some embodiments, the first part 31 of the passivation layer 30 with higher height H1 helps to enhance the robustness of the first electrical conductor 20, and helps to alleviate stress between the substrate 10 and the first electrical conductor 20. In some embodiments, the second portion 22 of the first electrical conductor 20 may include a first sub portion 221 laterally covered by the passivation layer 30, and a second sub portion 222 laterally exposed from the passivation layer 30.

As shown in FIG. 5C and FIG. 5D, a reflow operation is performed on the first electrical conductor 20 after the passivation layer 30 is formed to form a semiconductor device 4. In some embodiments, the first portion 21 of the first electrical conductor 20 is constrained by the substrate 10 during the reflow operation, and thus has a first width W1 substantially the same as the width before the reflow operation. In some embodiments, the first sub portion 221 of the second portion 22 of the first electrical conductor 20 is constrained by the first part 31 of the passivation layer 30 during the reflow operation, and thus has a second width W2 substantially the same as the width before the reflow operation. In some embodiments, the second sub portion 222 of the second portion 22 of the first electrical conductor 20 is exposed from the first part 31 of the passivation layer 30, thereby extending laterally after the reflow operation, and thus has a third width W3. After the reflow operation, the second width W2 is wider than the first width W1, the third width W3 is wider than the second width W2, and the second sub portion 222 is protruded laterally to partially overlap the passivation layer 30.

Figure 6A:
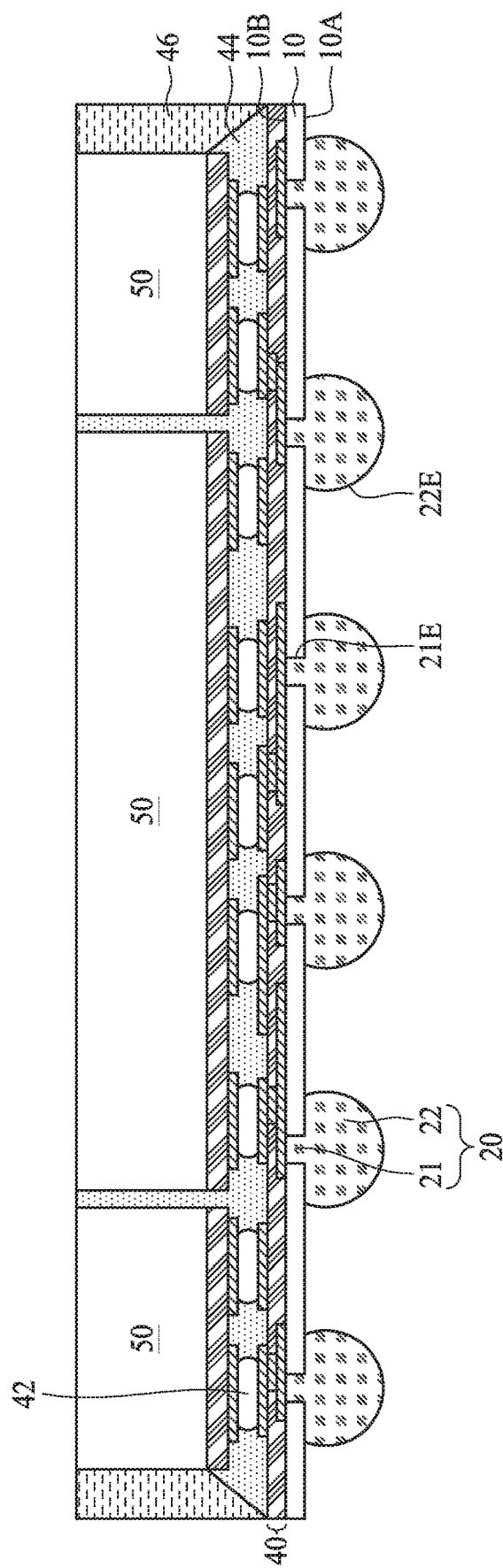
FIG. 6A, FIG. 6B and FIG. 6C are schematic views at one of various operations of manufacturing a semiconductor device according to one or more embodiments of the present disclosure.
Figure 6B:
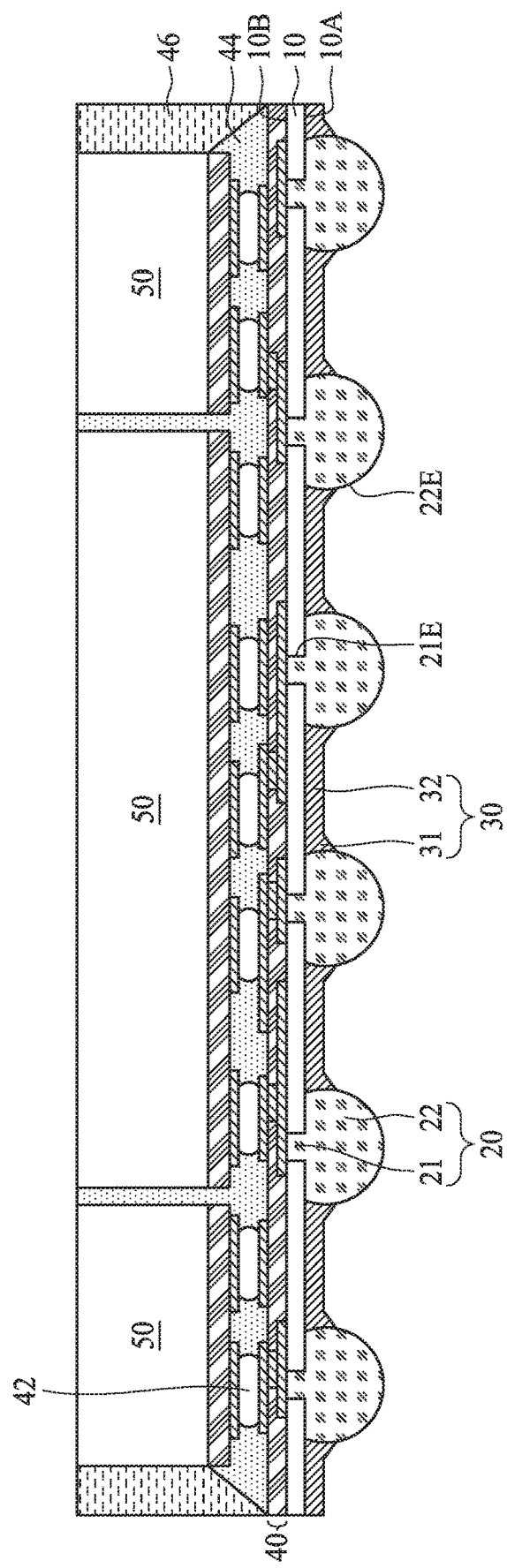
Figure 6C:
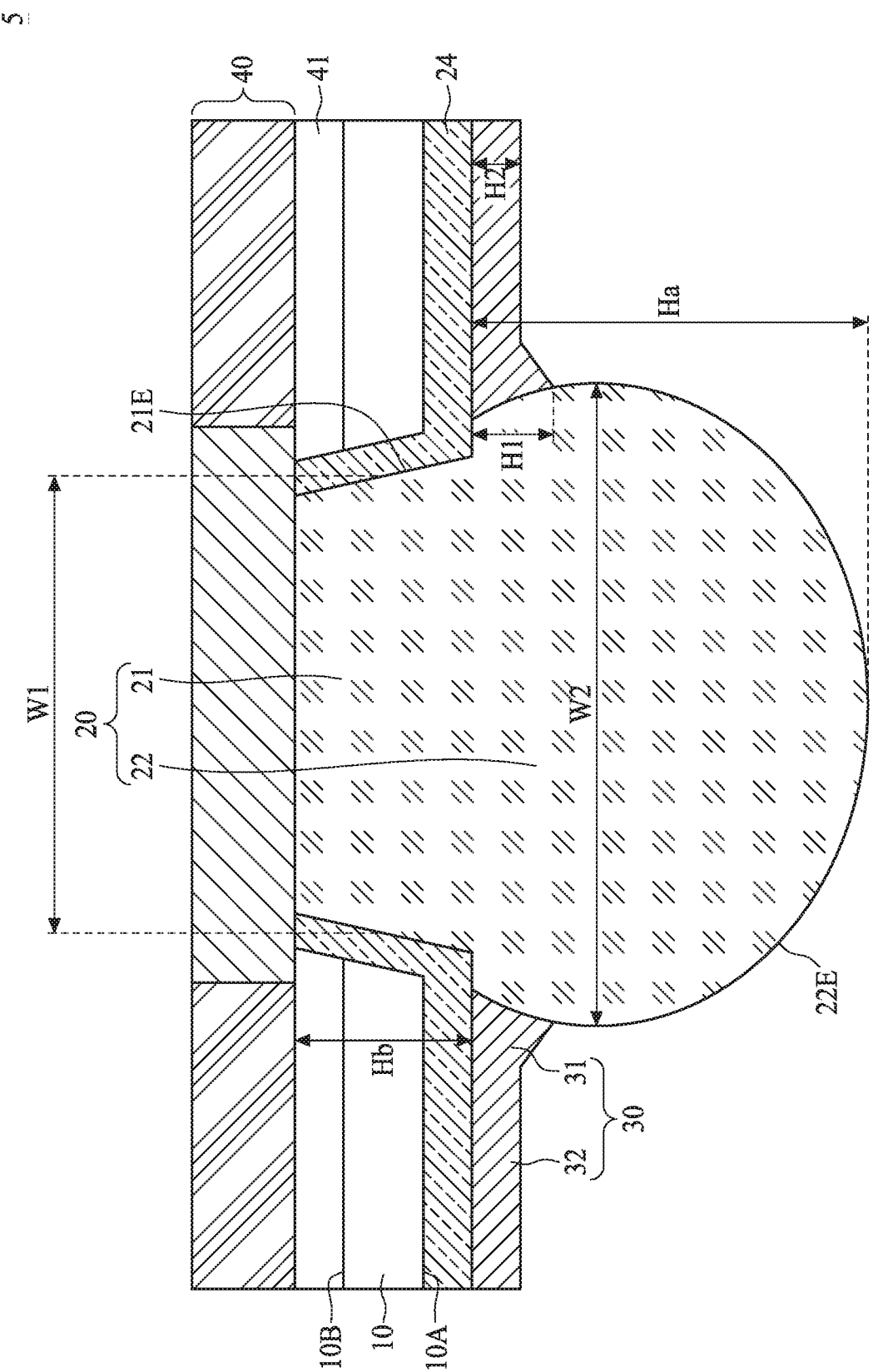

FIG. 6A, FIG. 6B and FIG. 6C are schematic views at one of various operations of manufacturing a semiconductor device according to one or more embodiments of the present disclosure, where FIG. 6A and FIG. 6B are schematic cross-sectional views, and FIG. 6C is a schematic partial enlarged cross-sectional view. As depicted in FIG. 6A, different from the semiconductor device 4 of FIG. 5C and FIG. 5D, the reflow operation is performed on the first electrical conductor 20 before the passivation layer 30 is formed. Since the second portion 22 of the first electrical conductor 20 is reflowed without being constrained, the second portion 22 of the first electrical conductor 20 is extended to have a substantially ball shape.

As depicted in FIG. 6B and FIG. 6C, the passivation layer 30 is formed over the first surface 10A of the substrate 10, partially covering an edge of the first electrical conductor 20 to form a semiconductor device 5. In some embodiments, the passivation layer 30 may be formed in a similar way as disclosed in FIG. 2C, but is not limited thereto. In some embodiments, the passivation layer 30 includes the first part 31 with the first height H1 and in contact with a portion of the edge 22E of the second portion 22 of the first electrical conductor 20, and the second part 32 with the second height H2 and apart from the edge 22E of the second portion 22 of the first electrical conductor 20 and connected to the first part 31. In some embodiments, the second width W2 of the second portion 22 of the first electrical conductor 20 is wider than the first width W1 of the first portion 21 of the first electrical conductor 20.

Figure 7A:
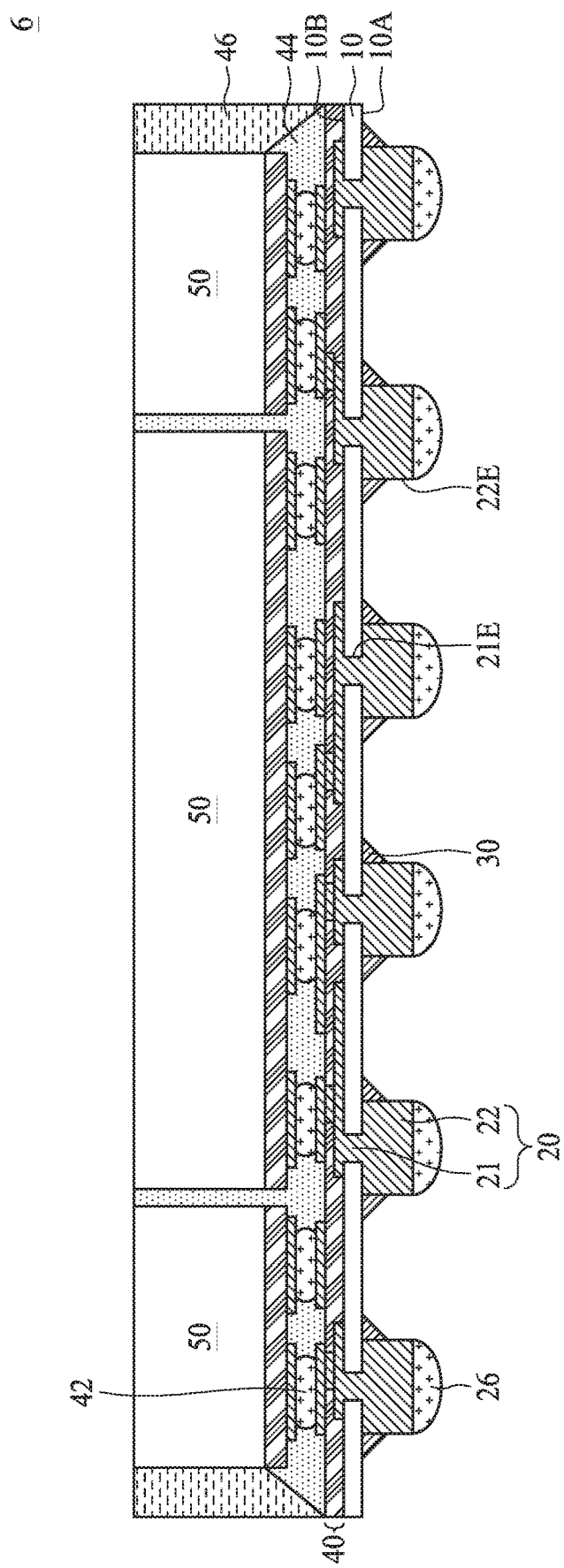
FIG. 7A and FIG. 7B are schematic views of a semiconductor device according to one or more embodiments of the present disclosure.
Figure 7B:
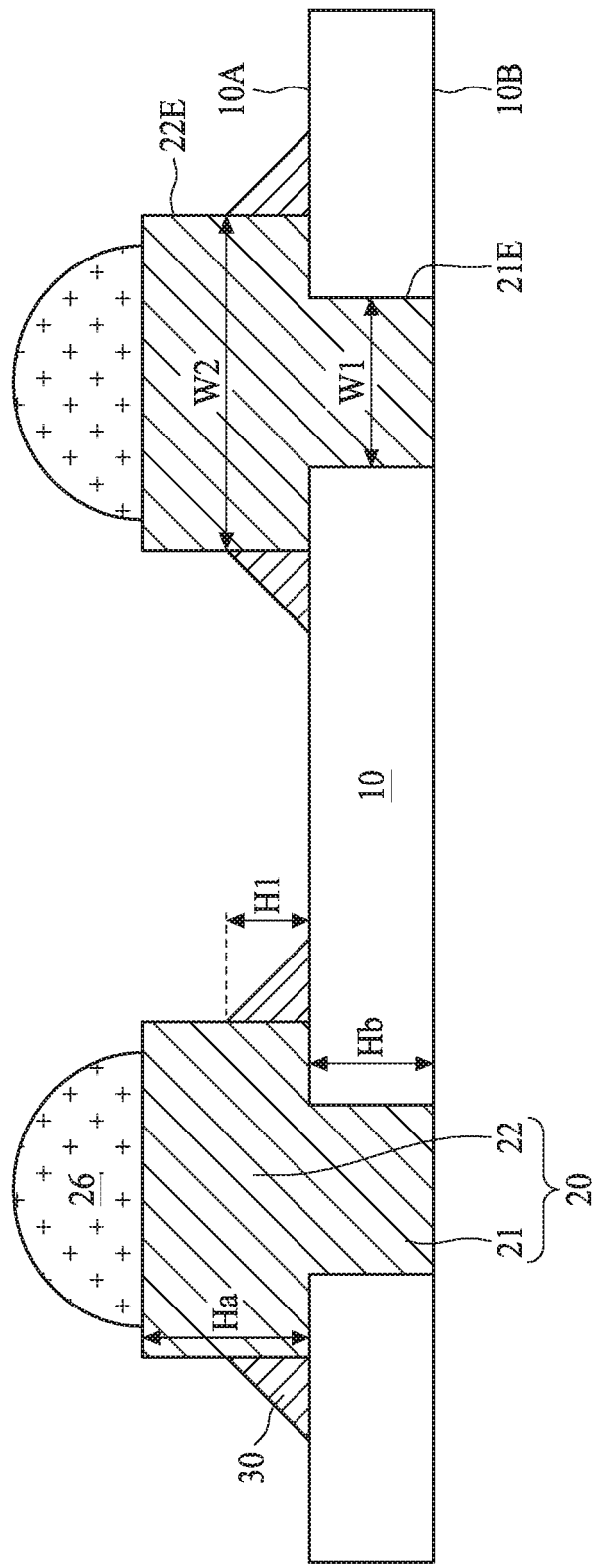

FIG. 7A and FIG. 7B are schematic views of a semiconductor device according to one or more embodiments of the present disclosure, wherein FIG. 7A is a schematic cross-sectional view, and FIG. 7B is a schematic partial enlarged cross-sectional view. As depicted in FIG. 7A and FIG. 7B, different from the semiconductor device 1 of FIG. 2E, the passivation layer 30 of the semiconductor device 6 at least partially covers the edge 22E of the second portion 22, but exposes the first surface 10A of the substrate 10. In some embodiments, the passivation layer 30 may include a doughnut-shaped structure surrounding the edge 22E of the second portion 22. The passivation layer 30 may has a height H lower than or equal to the height Ha of the second portion 22 of the first electrical conductor 20. In some embodiments, the passivation layer 30 with doughnut-shaped structure may be applied to other embodiments of the present disclosure.

Figure 8A:
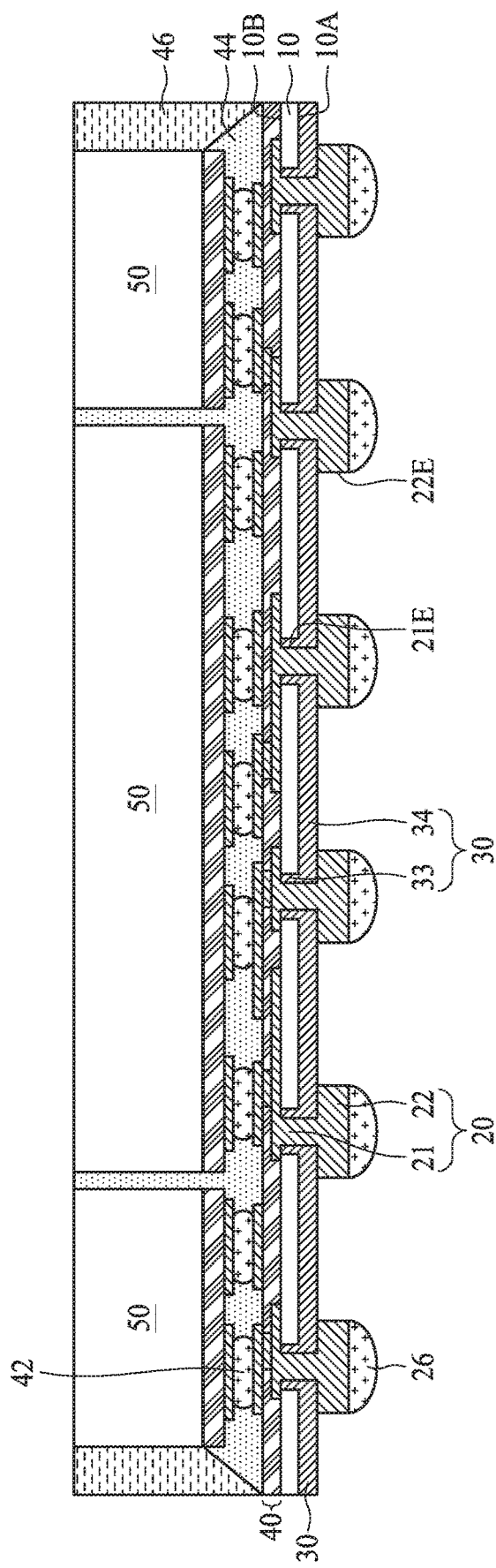
FIG. 8A and FIG. 8B are schematic views of a semiconductor device according to one or more embodiments of the present disclosure.
Figure 8B:
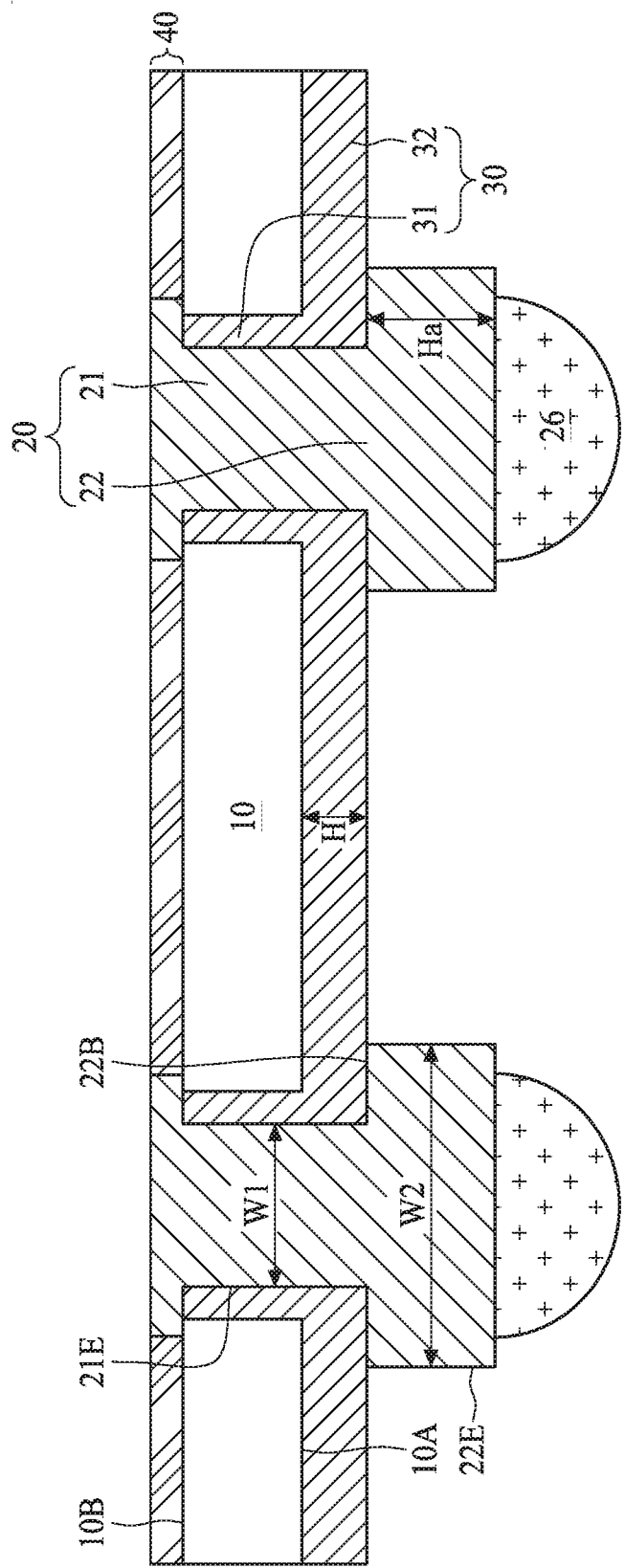

FIG. 8A and FIG. 8B are schematic views of a semiconductor device according to one or more embodiments of the present disclosure, wherein FIG. 8A is a schematic cross-sectional view, and FIG. 8B is a schematic partial enlarged cross-sectional view. As depicted in FIG. 8A and FIG. 8B, the semiconductor device 7 includes a substrate 10, first electrical conductors 20 adjacent to a first surface 10A of the substrate 10, and a passivation layer 30 over the first surface 10A of the substrate 10. In some embodiments, each of the first electrical conductors 20 includes a first portion 21 through the substrate 10, and a second portion 22 over the first surface 10A of the substrate 10 and connected to the first portion 21. In some embodiments, the first portion 21 of the first electrical conductor 20 includes a first width W1, and the second portion 22 of the first electrical conductor 20 includes a second width W2 wider than the first width W1. In some embodiments, the passivation layer 30 includes a first part 33 covering an edge 21E of the first portion 21, and a second part 34 between a surface 22B of the second portion 22 and the first surface 10A of the substrate 10. In some embodiments, the semiconductor device 7 may further include a circuit layer 40, at least one semiconductor die 50, second electrical conductors 42, an underfill layer 44 and an encapsulant 46 disposed over a second surface 10B of the substrate 10.

In some embodiments, the second part 34 of the passivation layer 30 has a height H substantially greater than about 10 micrometers. In some embodiments, the height H of the second part 34 is substantially ranging from about 10 micrometers to about 40 micrometers, or substantially ranging from about 10 micrometers to about 15 micrometers, but is not limited thereto. In some embodiments, the passivation layer 30 may include a polymeric passivation layer, and may be formed in a similar way as disclosed in FIG. 2C, but is not limited thereto. The second part 34 with a thicker thickness may help to provide a buffer and alleviate stress between the substrate 10 and the first electrical conductor 20, so as to reduce the risk of cracking of the substrate 10 and delamination of the first electrical conductors 20.

In some embodiments of the present disclosure, the passivation layer with a thicker part covering the edge of the electrical conductor helps to enhance the robustness of the electrical conductor, and helps to compensate or alleviate stress between the substrate and the electrical conductor. In some embodiments of the present disclosure, the passivation layer between the electrical conductor and the substrate helps to provide a buffer and alleviate stress between the substrate and the electrical conductor. In some embodiments of the present disclosure, the passivation layer may be formed from a hydrophilic photo-curable material by selectively dispensing, and can climb up to the edge of the electrical conductor.

In one exemplary aspect, a semiconductor device is provided. The semiconductor device includes a substrate, an electrical conductor and a passivation layer. The substrate includes a first surface. The electric conductor is over the first surface of the substrate. The passivation layer is over the first surface of the substrate. The passivation layer includes a first part and a second part. In some embodiments, the first part is in contact with an edge of the electrical conductor, the second part is connected to the first part and apart from the edge of the electrical conductor, and the first part of the passivation layer has curved surface.

In another aspect, a semiconductor device is provided. The semiconductor device includes a substrate, a plurality of electrical conductors and a passivation layer. The substrate includes a first surface. The electrical conductors are is over the first surface of the substrate. The passivation layer is over the first surface of the substrate and a portion of the electrical conductors. The passivation layer includes a plurality of first parts and at least a second part. In some embodiments, the first parts are respectively coupled to one of the electrical conductors, and the second part is coupled to tow adjacent first parts. In some embodiments, each of the first parts includes a curved surface. In some embodiments, a thickness of the first parts is greater than a thickness of the second part.

In yet another aspect, a method for manufacturing a semiconductor device is provided. The method includes following operations. A substrate is received. An electrical conductor is formed over a surface of the substrate. A photo-curable material is selectively dispensed over the surface of the substrate. The photo-curable material is irradiated to form a passivation layer is formed over the surface of the substrate, wherein the passivation layer partially covers an edge of the electrical conductor.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate including a first surface and a second surface opposite to the first surface;
   a first electrical conductor over the first surface of the substrate, wherein the first electrical conductor comprises a third surface directly contacting the first surface and a fourth surface directly contacting the second surface;
   a circuit layer directly on the second surface of the substrate, wherein a surface of the circuit layer is substantially flush with the second surface and the fourth surface;
   a second electrical conductor over the circuit layer and electrically connected to the first electrical conductor through the circuit layer; and
   a passivation layer over the first surface of the substrate, wherein the passivation layer includes a first part in contact with an edge of the first electrical conductor, and a second part connected to the first part and apart from the edge of the first electrical conductor, and the first part of the passivation layer has a curved surface.

2. The semiconductor device of claim 1, wherein the curved surface of the first part of the passivation layer includes a concaved surface.

3. The semiconductor device of claim 1, wherein a first height of the first part of the passivation layer is larger than a second height of the second part of the passivation layer.

4. The semiconductor device of claim 1, wherein the first electrical conductor comprises a first portion through the substrate, and a second portion over the first surface of the substrate and connected to the first portion, wherein a height of the second portion is greater than a height of the first portion.

5. The semiconductor device of claim 4, wherein a first height of the first part of the passivation layer is lower than a height of the second portion of the first electrical conductor.

6. The semiconductor device of claim 4, wherein the second portion of the first electrical conductor further comprises a first sub portion laterally covered by the passivation layer, a second sub portion exposed through the passivation layer, and a width of the first sub portion and a width of the second sub portion are substantially the same.

7. The semiconductor device of claim 1, further comprising a conductive bump disposed over the first electrical conductor.

8. The semiconductor device of claim 7, wherein a melting point of the conductive bump is less than a melting point of the first electrical conductor.

9. A semiconductor device, comprising:
   a semiconductor substrate including a first surface and a second surface opposite to the first surface;
   a first electrical conductor over the first surface of the semiconductor substrate;
   a circuit layer directly on the second surface of the semiconductor substrate, the circuit layer comprising a third surface facing the second surface and a fourth surface opposite to the third surface, wherein the third surface directly contacts the second surface, and the fourth surface is separated from the semiconductor substrate;
   a second electrical conductor over the circuit layer and electrically connected to the first electrical conductor through the circuit layer; and
   a passivation layer over the first surface of the semiconductor substrate, wherein the passivation layer includes a first part in contact with an edge of the first electrical conductor, and a second part connected to the first part and apart from the edge of the first electrical conductor, the first part of the passivation layer has a curved surface, and a thickness of the first part is greater than a thickness of the second part.

10. The semiconductor device of claim 9, wherein the first electrical conductor comprises a first portion through the semiconductor substrate, and a second portion over the first surface of the semiconductor substrate and connected to the first portion.

11. The semiconductor device of claim 10, wherein a first height of the first part of the passivation layer is lower than a height of the second portion of the first electrical conductor.

12. The semiconductor device of claim 9, further comprising a conductive bump disposed over the first electrical conductor.

13. A semiconductor device, comprising:
a substrate;
a plurality of first electrical conductors over the substrate;
a circuit layer, wherein the circuit layer is directly on the substrate, and the substrate is between the first electrical conductors and the circuit layer, the circuit layer comprising a first surface facing a surface of the substrate and a second surface opposite to the first surface, wherein the second surface is separated from the substrate, and the second surface contacts an underfill layer;
a plurality of second electrical conductors over the circuit layer and electrically connected to the first electrical conductors through the circuit layer; and
a passivation layer over the substrate and a portion of the first electrical conductors, wherein the passivation layer comprises a first part coupled to one of the first electrical conductors and at least a second part coupled to the first part, wherein the first part includes a curved surface, and a thickness of the first part is greater than a thickness of the second part.

14. The semiconductor device of claim 13, wherein the curved surface of the passivation layer includes a concaved surface, and the second part has a flat surface.

15. The semiconductor device of claim 13, wherein each of the first electric conductors comprises a first portion through the substrate, a second portion through the passivation layer connected to the first portion, and a third portion exposed through passivation layer and connected to the second portion.

16. The semiconductor device of claim 15, wherein a sum of a height of the second portion and a height of the third portion is greater than a height of the first portion.

17. The semiconductor device of claim 15, wherein a width of the second portion and a width of the third portion are greater than a width of the first portion.

18. The semiconductor device of claim 17, wherein the width of the third portion is substantially equal to the width of the second portion.

19. The semiconductor device of claim 13, further comprising a conductive bump disposed over each of the first electrical conductors.

20. The semiconductor device of claim 19, wherein a melting point of the conductive bump is less than a melting point of each of the first electrical conductors.

* * * * *